United States Patent [19]

Padalino et al.

[11] Patent Number: 4,668,964
[45] Date of Patent: May 26, 1987

[54] STIMULATOR FOR INKJET PRINTER

[75] Inventors: Marco Padalino, Dallas County, Tex.; Stephen J. Bolema, Santa Cruz County; Mark A. Culpepper, Santa Clara County, both of Calif.

[73] Assignees: Ricoh Company, Ltd., Tokyo, Japan; Ricoh Systems, Inc., San Jose, Calif.

[21] Appl. No.: 794,730

[22] Filed: Nov. 4, 1985

[51] Int. Cl.⁴ ..................... G01D 15/18; H01L 41/08; H01G 5/16
[52] U.S. Cl. ................................ 346/75; 346/140 R; 310/323; 310/328; 310/340; 310/367; 29/25.35; 29/25.41
[58] Field of Search ............ 346/75, 146 R; 310/311, 310/321, 323, 324, 328, 340, 342, 344, 352, 367, 370; 29/25.35, 25.41

[56] References Cited

U.S. PATENT DOCUMENTS

| | | | |
|---|---|---|---|
| 4,284,993 | 8/1981 | Kakeno | 346/75 |
| 4,303,927 | 12/1981 | Tsao | 346/75 |
| 4,386,453 | 6/1983 | Giachino et al. | 29/25.41 |
| 4,536,673 | 8/1985 | Forster | 310/327 |
| 4,554,558 | 11/1985 | Beaudet et al. | 346/75 |

Primary Examiner—E. A. Goldberg
Assistant Examiner—Gerald E. Preston
Attorney, Agent, or Firm—Flehr, Hohbach, Test, Albritton & Herbert

[57] ABSTRACT

A method of assembling a stimulator for an inkjet printer by attaching separate piezoelectric elements to a plastic or metallic membrane sheet which sheet, after encapsulation of the piezoelectric transducers, may be cut into a plurality of stimulators. Each individual stimulator which now comprises a membrane, a piezoelectric element, and the encapsulating material can then be bonded to an ink fluid cavity.

7 Claims, 4 Drawing Figures

U.S. Patent       May 26, 1987       4,668,964
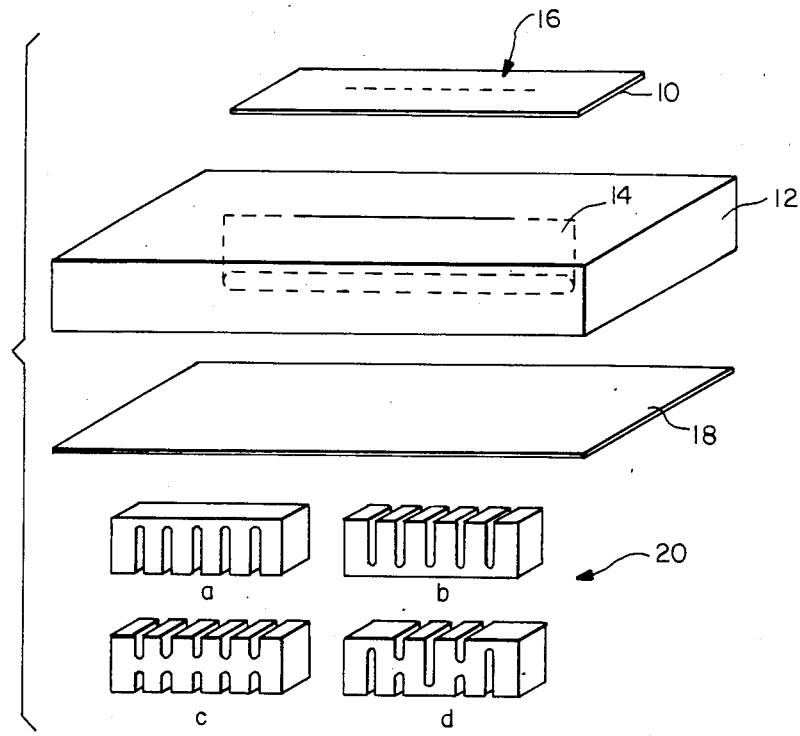
FIG.—1
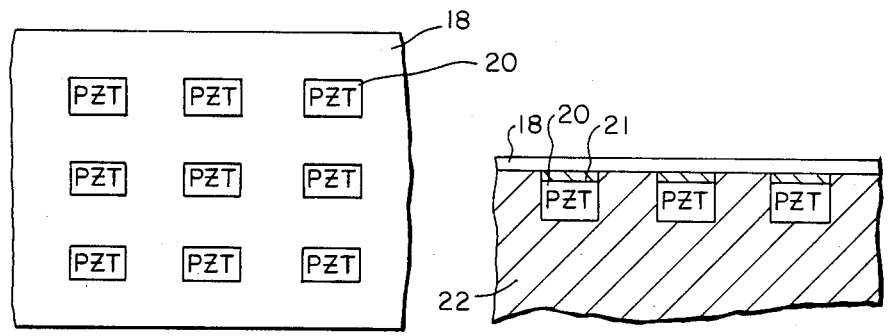
FIG.—2          FIG.—3
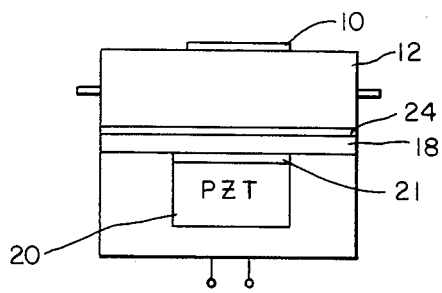
FIG.—4

STIMULATOR FOR INKJET PRINTER

BRIEF SUMMARY OF INVENTION

This invention is directed generally to the field of inkjet printers and more particularly to an improved method of assembly of a stimulator for an inkjet printer.

In recorders of the inkjet drop type, rows of orifices receive an electrically conductive recording fluid such as, for instance, a water base ink, from a pressurized fluid manifold. The ink is ejected in steams, flowing through the orifices in a plate with the formation of drops. The formation of drops is stimulated by the application of waves generated by acoustic transducers mounted to the rear of the orifice plate and ink manifold.

Graphic reproduction in recorders of this type is typically accomplished by selectively charging and deflecting some of the drops in each of the streams and thereafter, depositing the uncharged drops on a moving web of paper or other material. Charging of the drops is accomplished by application of charge control signals to charging electrodes near the edge of the ink drop stream, beyond the orifice.

As the drops separate from the fluid filaments, they carry a portion of the charge applied by the charging electrode. Thereafter, the drops pass through electrostatic fields which have no effect upon the uncharged drops, but which cause the charged drops to be deflected. Drops which are not to be printed are charged sufficiently to be deflected into a catcher.

A critical element in the construction of such an inkjet printer is the stimulator which causes the formation of ink drops at high repetition rate (100,000 drops per second, typically).

It is an objective of the present invention to provide a new and improved stimulator for an ink drop generator.

More particularly, it is an objective of the present invention to provide a stimulator which reduces the weight and size of the stimulator.

Most known ink drop printers which include an ink cavity stimulated by an acoustic transducer source have the two assemblies, i.e., cavity and stimulator, bolted or otherwise mechanically coupled together. This results in stresses and deformations of the orifice plate and therefore in jet misdirectionality.

It is an objective of the present invention to provide a method of assembly for a stimulator which reduces or substantially eliminates these stresses.

Another objective of the present invention is to provide improved acoustic coupling between the stimulator and the ink cavity by eliminating the O-rings and bolts.

Yet another objective of the present invention is to reduce the weight and size of the inkjet drop generator by eliminating the bolts and gaskets which are normally used to couple the stimulating acoustic transducer and the ink cavity.

A further objective of this invention is to reduce the cost of the stimulator by assembling it from fewer and lower cost parts, and by assembling it using a simplified assembly procedure.

The above advantages and improvements are achieved by assembling a stimulator for an inkjet printer by attaching separate piezoelectric elements to a plastic or metallic membrane sheet which sheet, after encapsulation of the piezoelectric transducers, may be cut into a plurality of stimulators. Each individual stimulator which now comprises a membrane, a piezoelectric element, and the encapsulating material can then be bonded to an ink fluid cavity.

The objects, advantages and features of the present invention will be more apparent from the following description of a preferred embodiment of the invention as illustrated in the accompanying drawings:

BRIEF DESCRIPTION OF DRAWINGS

FIG. 1 is an unassembled perspective view of the major elements of an inkjet drop generator which may be assembled in accordance with the method teachings of the present invention;

FIG. 2 shows a first step in the assembly of the piezoelectric elements bonded to a membrane;

FIG. 3 is a cross-section of the assembly of FIG. 2 along the line xx and illustrating the encapsulation step of the present method;

FIG. 4 is an elevational view, partially in section, showing the composite assembly of the stimulator as it is bonded to the cavity housing and orifice plate;

DETAILED DESCRIPTION

In FIG. 1, which is an unassembled view of the major elements of the ink jet drop generator, an orifice plate 10 is shown separated from the housing 12 with the ink cavity 14 therein. As the ink is expelled from cavity 14 due to external pressure applied to it, stimulation of the ink cavity will cause the ink filament to break into regularly spaced droplets.

The acoustic stimulation for the cavity is conveyed through a membrane 18 which is a stainless steel or similar material from an acoustic source 20. The acoustic source comprises a piezoelectric transducer (pzt) which is cut from a plate of piezoelectric material into any of a number of comb-like shapes a, b, c or d, as shown in FIG. 1 and indicated by the numeral 20. The common element to each of these shapes is that the slots extend across the piezoelectric material in the direction in which the acoustics waves are to be transmitted. It has been found that the formation of the pzt into these shapes reduces the bulk motion of the transducer and maximizes the efficiency of creation of motion of the transducer in the desired direction.

A significant element of the present invention is the manner in which these comb-like pzts are assembled in conjunction with the membrane 18 and the encapsulating material. The combination is then attached to the housing for the ink cavity utilizing a simplified assembly procedure which utilizes fewer parts and will provide improved acoustic coupling between the stimulator and the ink cavity. This improved coupling is achieved in part by the method and means of attaching the transducer to the membrane and to the housing which eliminates the use of O-rings, gaskets and the like.

As the first step in this process, several of the comb-like pzt elements 20 are bonded to the plastic or metallic membrane sheet 18. This bond is achieved using an epoxy which cements the transducer elements to the membrane. The structure which is formed by this step now comprises the membrane 18 with a regular array of piezoelectric elements bonded thereto. The reason for the use of a regular array, i.e., regular spacing between the piezoelectric elements, is to facilitate cutting the pzt elements 20 and attached membrane portion out of the composite array when each pzt 20 is to be assembled into an individual stimulator.

Turning to FIG. 3, it can be seen that the entire array of transducer elements 20 bonded by the bonding material 21 to the membrane 18 is then encapsulated in an encapsulating urethane foam. For example, the foam may be poured over the transducer array to provide a light and stable protctive material only on the pzt side of the membrane.

The encapsulated assembly is then cut down into individual stimulators, each consisting of a membrane portion, a pzt element, and the surrounding encapsulating material. After electrical testing of the stimulator so formed, each stimulator is then bonded onto an ink cavity housing. This bonding step is shown in FIG. 4 which illustrates the pzt element 20 bonding material 21, membrane 18 and second bonding layer 24 which couples the stimulator so formed to the ink cavity housing 12 which carries the orifice plate 10.

Clearly, this system of assembling the stimulator and the ink cavity maximizes acoustic coupling between the stimulator and cavity, while avoiding stresses which are induced when the two assemblies are bolted together. Moreover, the weight and size of the stimulator and the stimulator ink cavity combination are minimized.

While the invention has been particularly shown and described with reference to the preferred embodiment above, it will be understood by those skilled in the art that other changes in form and details may be made without departing from the spirit and scope of the invention which is defined in the following claims.

What is claimed:

1. A method of assembling a stimulator for an inkjet printer comprising a housing holding at least one piezoelectric transducer separated by a membrane from an ink cavity, the ink cavity having a printing outlet through an orifice to a recording medium, the assembly method comprising bonding a plurality of piezoelectric transducers to said membrane, encapsulating said transducers with a material surrounding said transducers up to said membrane to form a composite assembly, cutting said composite assembly into individual stimulators comprising a portion of said membrane, one of said transducers and the surrounding encapsulating material and bonding each of said transducers to an ink fluid cavity to form said stimulator.

2. A method as claimed in claim 1 wherein said membrane is made of plastic or metallic material that is compatible with the ink.

3. A method as claimed in claim 1 wherein epoxy is used to bond the transducers to the membrane.

4. A method as claimed in claim 1 wherein said transducers are bonded to said membrane in a regular substantially equally spaced array.

5. A method as claimed in claim 1 wherein the transducers are encapsulated in a polyurethane material.

6. A method as claimed in claim 1 including the further step of bonding said orifice plate over said printing outlet.

7. A stimulator for an inkjet printer comprising a housing having a first portion for holding said piezoelectric transducer, and a second portion defining an ink cavity therein, a piezoelectric transducer bonded by a first layer of bonding material to a membrane which separates said transducer from said second, a second layer of bonding material bonding said membrane and said transducer to said second portion of said housing, said piezoelectric transducer having a comb-like shape, comprising a plurality of slots in the face of said transducer, energization of said transducer causing ink to be expelled from said cavity.

* * * * *